(12) United States Patent
Abel et al.

(10) Patent No.: US 7,777,538 B2
(45) Date of Patent: Aug. 17, 2010

(54) METHOD AND APPARATUS FOR SLEW RATE CONTROL

(75) Inventors: Christopher J. Abel, Coplay, PA (US); Weiwei Mao, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 656 days.

(21) Appl. No.: 11/367,964

(22) Filed: Mar. 3, 2006

(65) Prior Publication Data

US 2007/0210832 A1 Sep. 13, 2007

(51) Int. Cl.
*H03K 5/13* (2006.01)
*H04L 7/00* (2006.01)

(52) U.S. Cl. .................. 327/144; 327/145; 327/295; 375/355; 375/340; 375/371; 326/93

(58) Field of Classification Search .................. 326/26, 326/32; 327/144, 261, 269, 295; 713/401
See application file for complete search history.

(56) References Cited

U.S. PATENT DOCUMENTS

| | | | |
|---|---|---|---|
| 5,150,364 A * | 9/1992 | Negus | 370/542 |
| 6,127,864 A * | 10/2000 | Mavis et al. | 327/144 |
| 6,459,313 B1 * | 10/2002 | Godbee et al. | 327/161 |
| 7,054,402 B2 * | 5/2006 | Muellner | 375/355 |
| 7,069,458 B1 * | 6/2006 | Sardi et al. | 713/401 |
| 7,268,605 B2 * | 9/2007 | Fang et al. | 327/261 |
| 2002/0184564 A1* | 12/2002 | Muellner | 714/32 |

* cited by examiner

*Primary Examiner*—Vibol Tan
(74) *Attorney, Agent, or Firm*—Ryan, Mason & Lewis, LLP

(57) ABSTRACT

Methods and apparatus are provided for controlling at least one of a rise time and a fall time of a signal. A plurality of time shifted clock signals are generated; and a received data signal is sampled using a plurality of parallel data paths, where each of the data paths are controlled by a corresponding one of the plurality of time shifted clock signals. The plurality of time shifted clock signals can be generated, for example, by at least one delay element. The plurality of parallel data paths can be substantially identical and comprise, for example, at least one latch or at least one flip flop. Compensation can optionally be provided for variations in, for example, process corner, supply voltage, aging and operating temperature.

21 Claims, 4 Drawing Sheets

500

600

METHOD AND APPARATUS FOR SLEW RATE CONTROL

FIELD OF THE INVENTION

The present invention is generally related to slew rate control techniques, and more particularly, to slew rate control techniques that do not exhibit data dependent jitter.

BACKGROUND OF THE INVENTION

Slew rate is an important characteristic of the design and operation of integrated circuit devices, especially output buffers in high speed serial transceivers. Generally, the slew rate is the rate at which the output from an electronic circuit or device can be driven from one limit to another limit over the dynamic range of the electronic circuit or device. For the output buffer of a serial transceiver, the slew rate is defined as $(V_1-V_0)/T_R$ for a rising output transition, and as $(V_1-V_0)/T_F$ for a falling output transition, where $V_0$ and $V_1$ are the output levels associated with a logic 0 and logic 1, respectively, and $T_R$ and $T_F$ are the output rise and fall times, respectively. If the slew rate of a high speed serial output buffer is too low, then the maximum output rate of the buffer will be limited. However, if the slew rate is too high, then the frequency spectrum of the output waveform will have significant high frequency components, causing the buffer to act as a source of electromagnetic interference and crosstalk noise. A number of standards for high-speed serial transceivers impose both upper and lower limits on the rise and fall times, and thus on the slew rate, of the serial output waveform.

A number of techniques have thus been proposed or suggested for controlling the rise and fall times of a signal. The rise and fall times of the output buffers is often a function of the power supply voltage, as well as process and temperature variations within the integrated circuit device. Conventional rise and fall time control techniques tend to be sensitive to process, supply voltage and temperature variations, and cannot be adjusted very precisely.

Typically, rise and fall time control in an output buffer is implemented by placing a number of analog delay cells connected in series in the data path. The output driver is split into a set of smaller driver cells with outputs connected in parallel, each of which is driven by the output of one of the delay cells in the data path. The delay elements generate a corresponding number of time shifted versions of the data signal, which are then aggregated to provide a stepped version of the data signal. Generally, the total delay through the delay elements determines the rise and fall times, while the number of delay elements determines the smoothness.

The inclusion of delay elements in the data path, however, causes data dependent jitter. Generally, when random data is passed through bandwidth-limited analog delay elements, there is a tendency to stretch wide pulses (such as associated with a string of binary ones) and to compress narrow pulses (such as a binary one between strings of binary zeros).

A need therefore exists for improved rise and fall time control techniques that do not rely on delay elements in the data path. A further need exists for rise and fall time control techniques that can adjust the rise and fall times of the output buffers over a relatively large range so that a slew rate can be selected based on the application data rate. A further need exists for rise and fall time control techniques that can control the rise and fall times of an output buffer so that they are substantially independent of supply voltage, operating temperature, and processing.

SUMMARY OF THE INVENTION

Generally, methods and apparatus are provided for controlling the rise and fall times of a signal. The disclosed rise and fall time control techniques do not rely on delay elements in the data path. The rise and fall times of an output buffer can be controlled so that they are substantially independent of supply voltage, operating temperature, and processing. According to one aspect of the invention, a plurality of time shifted clock signals are generated; and a received data signal is sampled using a plurality of parallel data paths, where each of the data paths are controlled by a corresponding one of the plurality of time shifted clock signals. The plurality of time shifted clock signals can be generated, for example, by at least one delay element. In such an embodiment, the delay, $T_D$, provided by the at least one delay element can be controlled. In one exemplary implementation, the plurality of parallel data paths are substantially identical and comprise at least one latch or at least one flip flop.

According to another aspect of the invention, compensation is optionally provided for variations in, for example, process corner, supply voltage, aging and operating temperature. The compensation can be performed by generating an analog control voltage, $V_{SRCT}$, that compensates for the variations by adjusting a delay, $T_D$, of one or more delay elements. The analog control voltage, $V_{SRCT}$, may be generated, for example, using an amplifier having a gain, G, to allow for small adjustments to the rise and fall times.

A more complete understanding of the present invention, as well as further features and advantages of the present invention, will be obtained by reference to the following detailed description and drawings.

DETAILED DESCRIPTION

The present invention provides improved rise and fall time control techniques that do not rely on delay elements in the data path. Rather, rise and fall time control is achieved with the present invention by placing one or more delay elements in the clock path. In addition, the present invention provides rise and fall time control techniques that adjust the rise and fall times of the output buffers over a relatively large range so that rise and fall times can be selected based on the application data rate.

Figure 1:
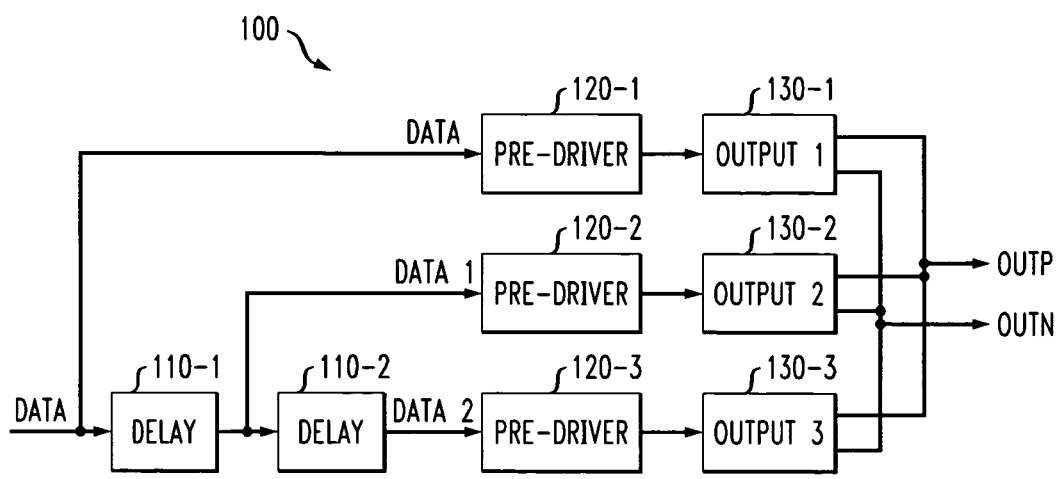
FIG. 1 illustrates a conventional output buffer that employs rise and fall time control in the data path.

FIG. 1 illustrates a conventional output buffer 100 that employs rise and fall time control in the data path. As shown in FIG. 1, the exemplary output buffer 100 includes two delay elements 110-1, 110-2 for delaying the data signal to generate three time shifted data signals, data, data 1, and data 2. The three time shifted data signals, data, data 1, and data 2 are then each passed through pre-drivers 120 and output stages 130 and then summed up at outputs OUTP and OUTN, in a known manner. By controlling the delay of the delay elements 110-1, 110-2, the rise and fall times of the outputs can be adjusted. As previously indicated, the total delay through the delay elements 110-1, 110-2 determines the slope imposed by the rise and fall time control circuitry and the number of delay elements determines the smoothness.

Figure 2:
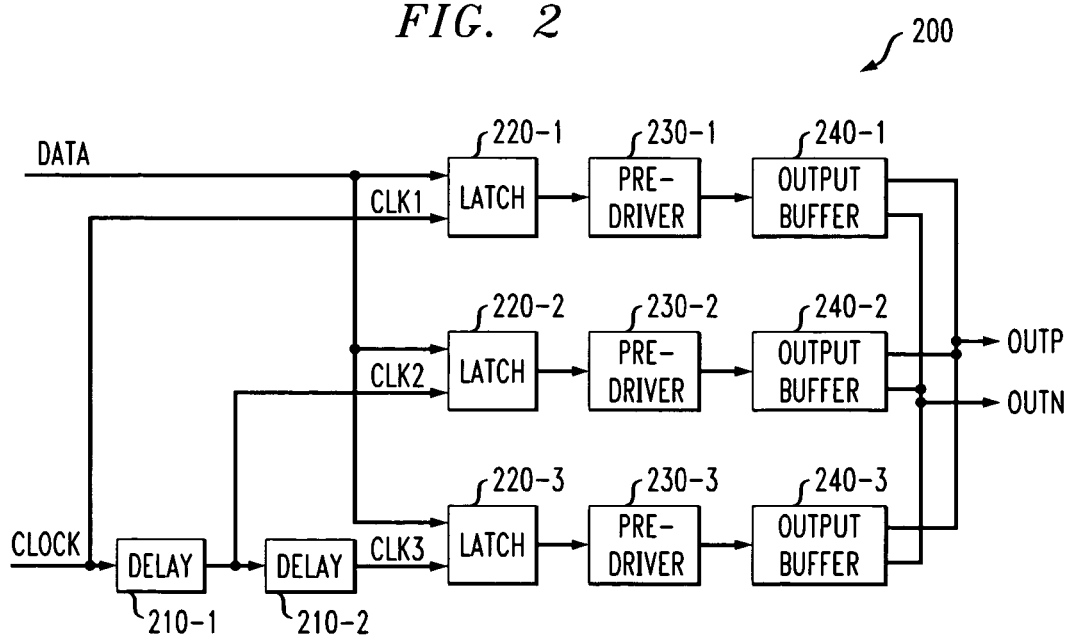
FIG. 2 illustrates a schematic block diagram of an output buffer employing rise and fall time control in the clock path, in accordance with the present invention.

FIG. 2 illustrates a schematic block diagram of an output buffer 200 employing rise and fall time control in the clock path, in accordance with the present invention. Generally, the output buffer 200 employs rise and fall time control circuitry in the clock path to adjust the rise and fall times of the output buffer 200. The present invention recognizes that the clock path is data pattern independent, and the slew rate control will not add additional data pattern dependant jitter at the outputs, OUTP and OUTN.

As shown in FIG. 2, the exemplary output buffer 200 includes two delay elements 210-1, 210-2 for delaying the clock signal to generate three time shifted clock signals, CK1, CK2, and CK3. The exemplary output buffer 200 comprises three identical data paths. In a normal operating mode (without rise and fall time control), the clock signals, CK1, CK2, and CK3 will reach each data path at the same time. In a rise and fall time control mode, the three time shifted clock signals, CK1, CK2, and CK3 are used to control the latching of the data signal performed by corresponding latches 220-1, 220-2 and 220-3. The outputs of the latches 220 are then each passed through pre-drivers 230 and output buffers 240, in a known manner, and summed together at outputs OUTP and OUTN. The output buffers 240 may be embodied, for example, as CML or H-bridge drivers.

The rise and fall times at the outputs OUTP/OUTN depends on the delay of each of the delay cells 210. These delays may be made controllable by one or more rise and fall time control signals, using techniques known to one of ordinary skill in the art. For example, the bandwidth of the delay cells may be increased or decreased by changing a bias voltage or current, or by changing the load capacitance of each delay cell. Since the rise and fall time control circuit is in the clock path of the output buffer 200, the rise and fall time control circuit will not introduce additional data pattern dependant jitter at the outputs OUTP/OUTN.

Figure 3:
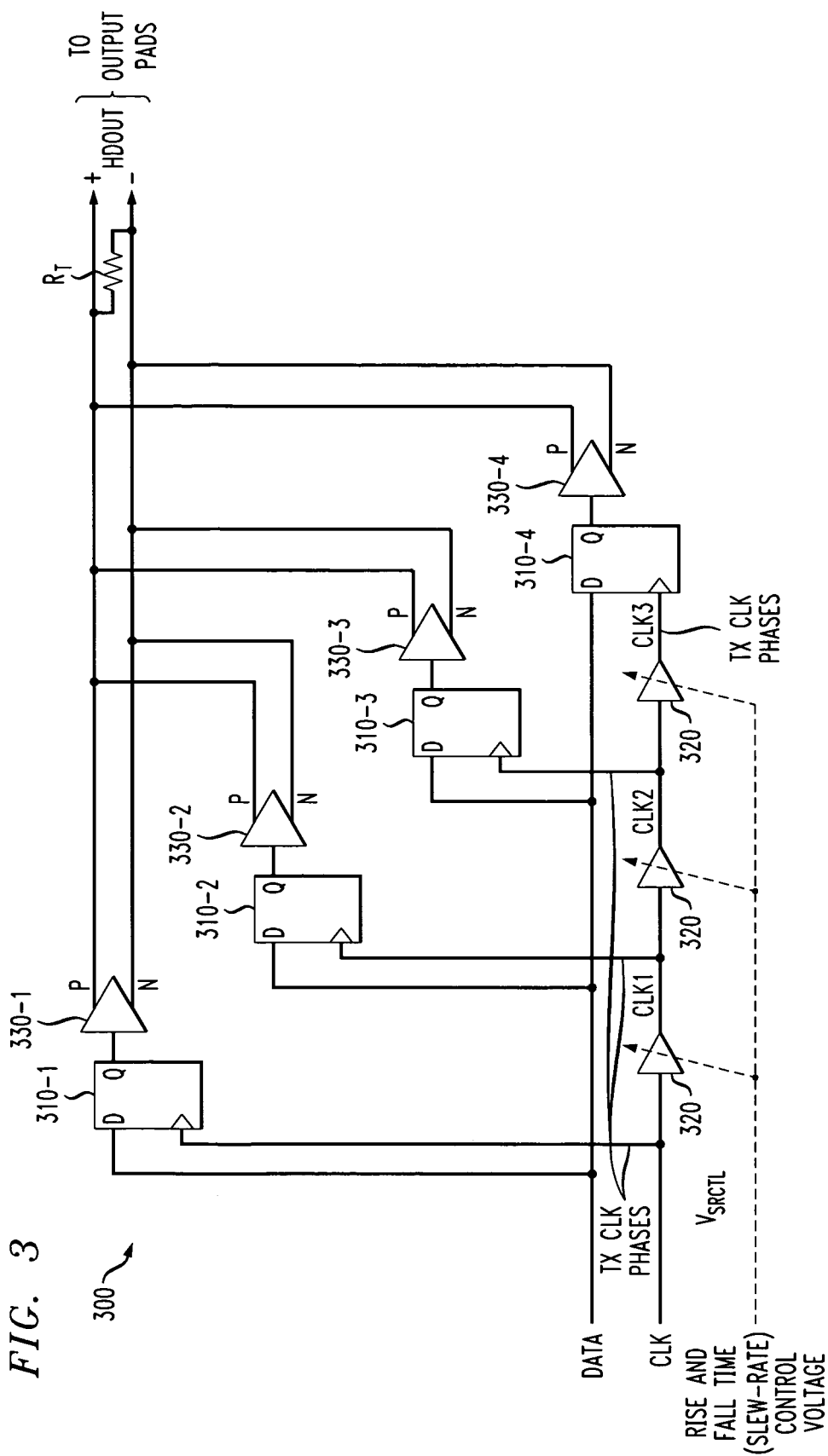
FIG. 3 illustrates one embodiment of an output buffer in accordance with the present invention.

FIG. 3 illustrates one embodiment of an output buffer 300 in accordance with the present invention. As shown in FIG. 3, in one exemplary embodiment, a data signal is applied to the data input, D, of a number of flip flops 310-1 through 310-4. In addition, the exemplary output buffer 300 includes three delay elements 320-1 through 320-3 (N=3) for delaying the clock signal to generate four time shifted clock signals, CLK1 through CLK4. The delay, $T_D$, provided by each delay elements 320-1 through 320-3 may optionally be controlled, for example, by a rise and fall time (slew rate) control voltage, $V_{SRCTL}$. In a further variation, the delay, $T_D$, provided by each delay elements 320-1 through 320-3 may be manually established. Typically, the delay time is controlled by adjusting the load capacitance on the delay elements 320-1 through 320-3 in discrete increments.

Each clock signal, CLK1 through CLK4, is applied to the clock input of a respective flip flop 310-1 through 310-4 to latch the data signal. The outputs of the flip flops 310-1 through 310-4 are applied to corresponding output buffers 330-1 through 330-4, which may be embodied, for example, as H-bridge or CML drivers. In the embodiment of FIG. 3, the H-bridge or CML driver consists of current-steering differential pairs and is split into N+1 equal sized sub-drivers, each of which steers 1/(N+1) of the total load current across the load resistance, $R_T$. Each of the N+1 sub-drivers receives the same sequence of data bits; however, the clock phase which loads a new bit into each sub-driver is delayed from the clock phase of the previous sub-driver by the delay, $T_D$. As a result, the switching of the load current is "spread out" over a time period of (N)×$T_D$, and the output rise and fall time is thus controlled by adjusting the clock delay, $T_D$.

Figure 4:
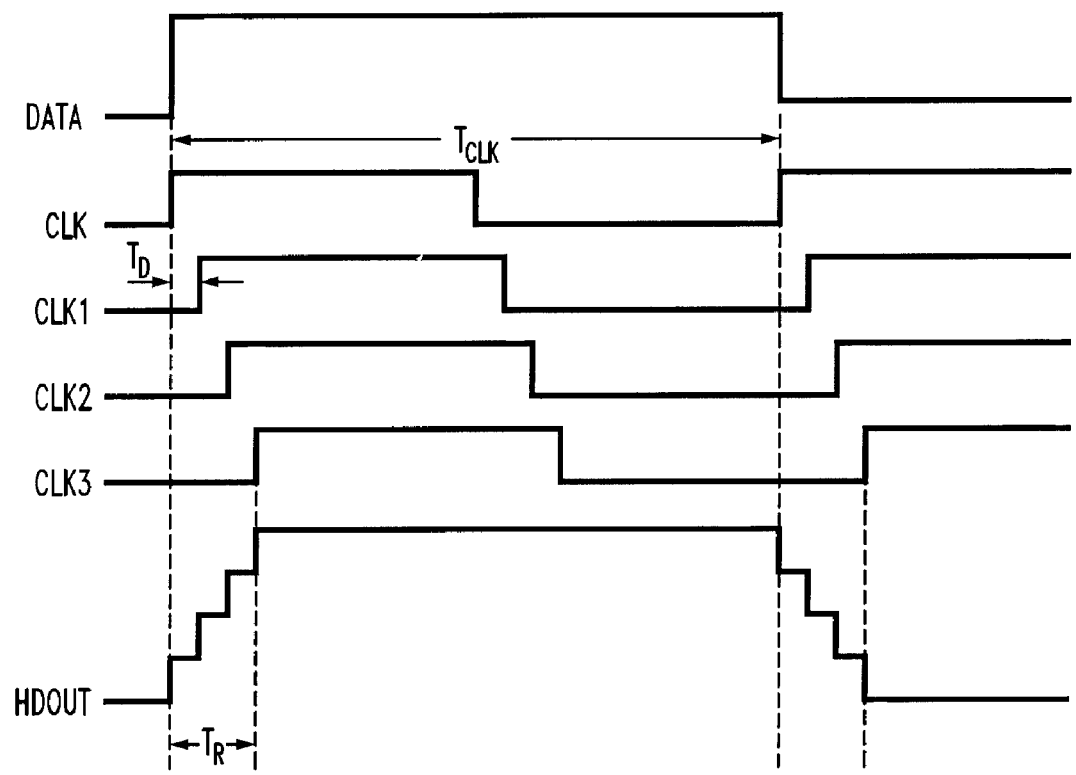
FIG. 4 illustrates the exemplary waveforms generated by the circuit of FIG. 3.

FIG. 4 illustrates the exemplary waveforms generated by the circuit 300 of FIG. 3. As shown in FIG. 4, the rising edge of the data and clock signals, Data and CLK, are time aligned. The clock signal CLK1 is time shifted from the clock signal CLK by an amount equal to $T_D$. Likewise, the clock signal CLK2 is time shifted from the clock signal CLK1 by an amount equal to $T_D$. Finally, the clock signal CLK3 is time shifted from the clock signal CLK2 by an amount equal to $T_D$.

In addition, the total rise (and fall time), $T_R$ is approximately equal to N×$T_D$, which is 3$T_D$ in the exemplary embodiment shown in FIGS. 3 and 4. In other words, with the exemplary rise and fall time control circuit 300 it takes three delay intervals, 3$T_D$, to rise from a binary value of zero to a binary value of one (and likewise to fall from a binary value of one to a binary value of zero).

While the rise and fall time control circuitry of FIG. 3 provides improved rise and fall time control by placing one or more delay elements in the clock path, as opposed to the data path, the delay, $T_D$, in the rise and fall time control circuitry of FIG. 3 is a function not only of the load capacitance of each delay cell, but also of the process corner, supply voltage, aging and operating temperature (collectively referred to herein as PVT variations). Thus, the rise and fall time may not be well controlled, unless a compensation scheme is provided for PVT variations, such as a delay-locked-loop (DLL).

Figure 5:
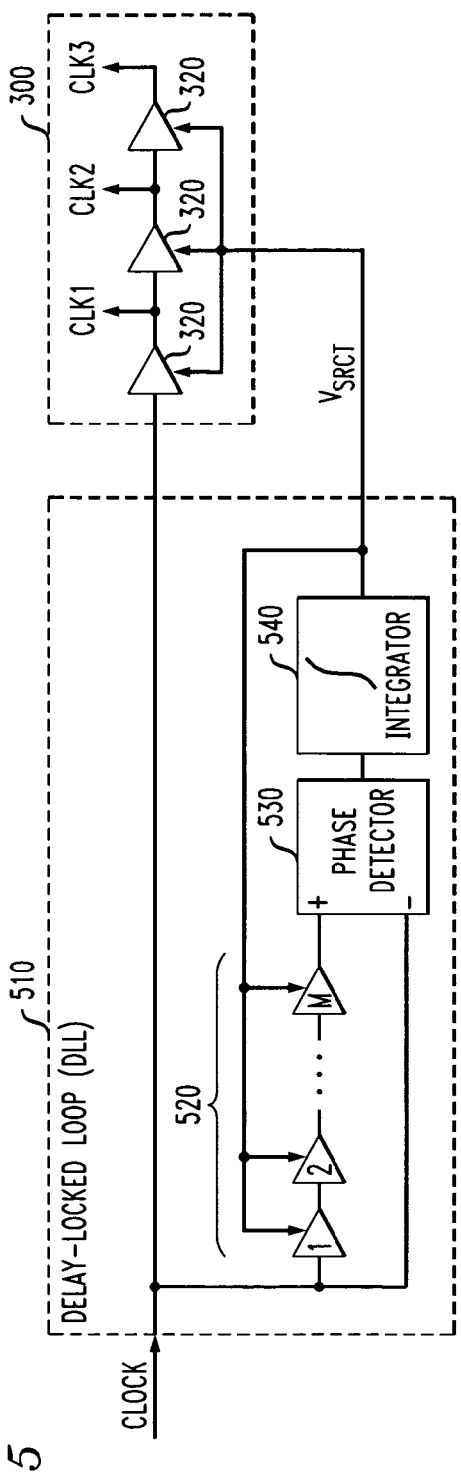
FIG. 5 illustrates a second embodiment of an output buffer in accordance with the present invention.

FIG. 5 illustrates a second embodiment of an output buffer 500 in accordance with the present invention. The output buffer 500 of FIG. 5 includes the output buffer 300 of FIG. 3, as well as a PVT compensation circuit 510. In one exemplary embodiment, the PVT compensation circuit 510 comprises a delay-locked loop (DLL) that generates an analog control voltage, $V_{SRCT}$. The control voltage, $V_{SRCT}$, compensates for PVT variations by adjusting the delay, $T_D$, of each of M delay elements 520, such that the total delay, M×$T_D$, is approximately equal to the period of the main clock, $T_{CLK}$. The DLL 510 also comprises a phase detector 530 and an integrator 540 in a known manner. Generally, each individual delay element in the DLL 510 is substantially matched to the delay elements 320 from the rise and fall time control circuit 300. Thus, $$T_D = \frac{T_{CLK}}{M}.$$

Since the rise time of the HDOUT waveform (see FIG. 3) is approximately equal to the delay through the three delay cells 320, then the total rise (and fall time), $T_R$, is approximately equal to N×$T_D$, which is 3$T_D$ in the exemplary embodiment shown in FIGS. 3 and 5. In addition, the total rise (and fall time), $T_R$, can be expressed as follows:

$$T_R \approx 3 \times T_D = \frac{3}{M} T_{CLK}.$$

Thus, by controlling the delay, $T_D$, of the rise and fall time clock buffers 320 using the control voltage, $V_{SRCT}$, generated by the DLL 510 comprised of similar delay cells, then the rise and fall time will be a fixed fraction of the clock period. In other words, the DLL 510 makes the rise (and fall) time, $T_R$, a controlled percentage of the period, $T_{CLK}$. For example, if M equals 10, and N equals 3, then the rise and fall times would be 30% of the period, $T_{CLK}$. The DLL 510 ensures that this is true, independent of PVT variations.

It is noted that by increasing or decreasing the number, N, of delay cells 320 in the clock path, or increasing or decreasing the number, M, of delay cells in the DLL 510, the rise and fall time, $T_R$, can be any rational fraction of the period, $T_{CLK}$:

$$T_R \propto \frac{N}{M} T_{CLK}$$

In one variation, the same set of delay cells can operate as the delay cells 320 and the delay cells 520, but only N delay cells of the total M cells are used to generate time-shifted clock signals.

It is further noted that there is a practical upper limit to the number, M, of delay cells in the DLL 510 because of a manufacturing process limit as to how small $T_D$ can be.

Figure 6:
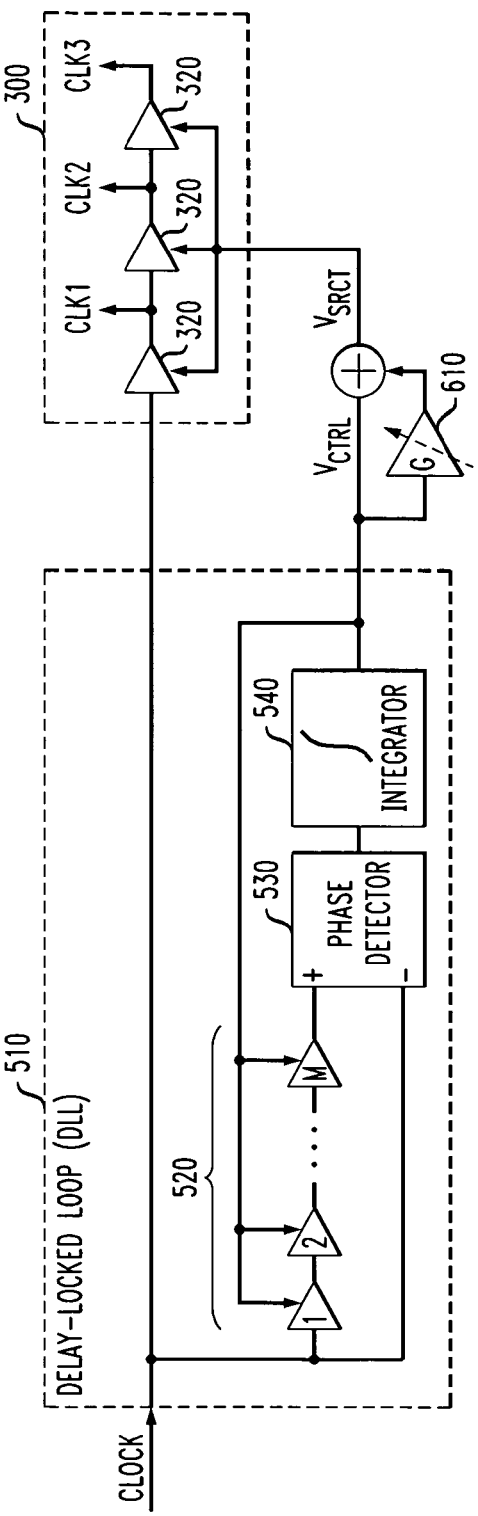
FIG. 6 illustrates a third embodiment of an output buffer in accordance with the present invention that provides fine control of the rise time, $T_R$.

FIG. 6 illustrates a third embodiment of an output buffer 600 in accordance with the present invention, that provides finer control of the rise time, $T_R$, than the embodiment of FIG. 5. In the embodiment of FIG. 6, a gain stage 610, having a gain, G, where the G is much less than 1 but may be positive or negative, is employed to allow small adjustments to the rise and fall times. Thus, the control voltage, $V_{SRCT}$, may be expressed as follows:

$$V_{SRCT} = (1+G)V_{CTRL}$$

where G is a small number (positive or negative).

If the delay of each of the delay cells in the DLL is equal to $$T_D = AV_{CTRL}^\alpha$$

(where a typical value for α would be −½), then, the derivative of $T_D$ with respect to the DLL control voltage, $V_{CTRL}$, is $$\frac{dT_D}{dV_{CTRL}} = \alpha A V_{CTRL}^{\alpha-1} = \alpha \frac{T_D}{V_{CTRL}}.$$

Intuitively, this expression suggests that a small change to $V_{CTRL}$ results in a corresponding small change in $T_D$.

For example, if α equals −½ and $\delta V_{CTRL}$ is a 1% change in $V_{CTRL}$, then $T_D$ would change by approximately:

$$\delta T_D = \left(\frac{dT_D}{dV_{CTRL}}\right) \delta V_{CTRL}$$
$$= \alpha T_D \frac{\delta V_{CTRL}}{V_{CTRL}}$$
$$= -\frac{1}{2} T_D (0.01)$$
$$= -0.005 T_D.$$

In other words, a 1% change in $V_{CTRL}$ will result in a 0.5% change in $T_D$, and thus in the rise (and fall) time, $T_R$.

Thus, the implementation shown in FIG. 6 allows the user to control the rise (and fall) time, $T_R$, of the output by small percentages above and below $(N/M) \times T_{CLK}$.

It is noted that an ever larger percentage of high-speed serial transceivers make use of "digital" approaches to clock and data recovery (CDR), many of which require a multi-output delay line. Thus, for such transceivers the DLL employed by the present invention is not an additional circuit needed to implement the rise and fall time control scheme.

At least a portion of the rise and fall time control circuitry of the present invention may be implemented in an integrated circuit. In forming integrated circuits, a plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention. For example, it is also possible to use a PLL, with the delay cells used in the TX rise and fall time control circuit matching those in the VCO, instead of the DLL. In addition, while the invention has been illustrated herein using voltage controlled delay lines, current controlled delay lines could also be employed, as would be apparent to a person of ordinary skill.

We claim:

1. A method for controlling at least one of a rise time and a fall time of a data signal, comprising:
    generating a plurality of time shifted clock signals using at least one delay element having an adjustable delay, wherein each of said time shifted clock signals has a substantially equal time difference with an adjacent time shifted clock signal;
    sampling said data signal using a plurality of parallel data paths, each of said data paths controlled by a corresponding one of said plurality of time shifted clock signals; and
    summing an output of each of said plurality of parallel data paths.

2. The method of claim 1, further comprising the step of controlling a delay, $T_D$, provided by said at least one delay element.

3. The method of claim 1, wherein each of said plurality of parallel data paths controls a corresponding current mode output buffer that steers a portion of the total load current across a load resistance.

4. The method of claim 1, wherein each of said plurality of parallel data paths receives the same sequence of data bits.

5. The method of claim 2, further comprising the step of compensating for variations of one or more of process corner, supply voltage, aging and operating temperature.

6. The method of claim 5, wherein said compensating step generates an analog control voltage, $V_{SRCT}$, that compensates for said variations by adjusting a delay, $T_D$, of one or more delay elements.

7. The method of claim 6, wherein said analog control voltage, $V_{SRCT}$, is based on an output, $V_{CTRL}$, of a delay-locked loop (DLL) circuit and is generated using a gain stage having a gain, G, to allow small adjustments to the at least one of said rise and fall times.

8. The method of claim 7, wherein a predefined percentage change in said output of said DLL circuit, $V_{CTRL}$, results in a corresponding percentage change in adjusting a delay, $T_D$, of one or more delay elements.

9. The method of claim 7, wherein a predefined percentage change in said output of said DLL circuit, $V_{CRTL}$, results in a corresponding percentage change in a rise time, $T_R$.

10. The method of claim 1, wherein said plurality of parallel data paths are substantially identical.

11. The method of claim 1, wherein each of said plurality of parallel data paths comprise one or more of at least one latch and at least one flip flop.

12. A circuit for adjusting at least one of a rise time and a fall time of a data signal, comprising:
    one or more delay elements for generating a plurality of time shifted clock signals, wherein at least one of said one or more delay element has an adjustable delay, wherein each of said time shifted clock signals has a substantially equal time difference with an adjacent time shifted clock signal;
    a plurality of parallel data paths for sampling said data signal, each of said data paths controlled by a corresponding one of said plurality of time shifted clock signals; and
    a summer for summing an output of each of said plurality of a parallel data paths.

13. The circuit of claim 12, wherein each of said plurality of parallel data paths controls a corresponding current mode output buffer that steers a portion of the total load current across a load resistance.

14. The circuit of claim 12, wherein each of said plurality of parallel data paths receives the same sequence of data bits.

15. The circuit of claim 12, further comprising a circuit for compensating for variations of one or more of process corner, supply voltage, aging and operating temperature.

16. The circuit of claim 15, wherein said compensating circuit is a delay-locked loop (DLL) circuit that comprises a plurality of delay elements that are substantially matched to said one or more delay elements for generating said plurality of time shifted clock signals.

17. The circuit of claim 16, wherein control of a delay, $T_D$, of said one or more delay elements for generating said plurality of time shifted clock signals using a control voltage, $V_{SRCT}$, generated by said DLL circuit provides at least one of a rise time and a fall time that is a controlled percentage of a clock period.

18. The circuit of claim 15, wherein said compensating circuit generates an analog control voltage, $V_{SRCT}$, that compensates for said variations by adjusting a delay, $T_D$, of one or more delay elements.

19. The circuit of claim 12, wherein said plurality of parallel data paths are substantially identical.

20. The circuit of claim 12, wherein each of said plurality of parallel data paths comprise one or more of at least one latch or at least one flip flop.

21. The circuit of claim 12, wherein said circuit is an integrated circuit.

* * * * *